(12) United States Patent
Rothacher

(10) Patent No.: US 8,680,665 B2
(45) Date of Patent: Mar. 25, 2014

(54) ENCAPSULATION, MEMS AND ENCAPSULATION METHOD

(75) Inventor: Peter Rothacher, Bruchsal (DE)

(73) Assignee: Robert Bosch GmbH, Stuttgart (DE)

( * ) Notice: Subject to any disclaimer, the term of this patent is extended or adjusted under 35 U.S.C. 154(b) by 319 days.

(21) Appl. No.: 13/063,722

(22) PCT Filed: Jul. 15, 2009

(86) PCT No.: PCT/EP2009/059009
§ 371 (c)(1),
(2), (4) Date: Mar. 11, 2011

(87) PCT Pub. No.: WO2010/028884
PCT Pub. Date: Mar. 18, 2010

(65) Prior Publication Data
US 2011/0180887 A1    Jul. 28, 2011

(30) Foreign Application Priority Data
Sep. 15, 2008  (DE) .......................... 10 2008 042 106

(51) Int. Cl.
*H01L 23/31*     (2006.01)

(52) U.S. Cl.
USPC .................... 257/684; 257/415; 257/E23.125; 438/51; 438/126

(58) Field of Classification Search
USPC .................. 257/415–420, 678–733, E23.128; 438/51
See application file for complete search history.

(56) References Cited

U.S. PATENT DOCUMENTS

| | | | |
|---|---|---|---|
| 7,373,821 B2 * | 5/2008 | Sakai et al. | 73/514.01 |
| 8,242,569 B2 * | 8/2012 | Rothacher | 257/415 |
| 2002/0121702 A1 | 9/2002 | Higgins, III | |

FOREIGN PATENT DOCUMENTS

| DE | 10 2006 031 047 | 1/2007 |
|---|---|---|
| WO | 95/30276 | 11/1995 |
| WO | 03/085729 | 10/2003 |

OTHER PUBLICATIONS

International Search Report corresponding to PCT Application No. PCT/EP2009/059009, mailed Nov. 2, 2010 (German and English language document) (5 pages).

* cited by examiner

*Primary Examiner* — Julio J Maldonado
*Assistant Examiner* — Daniel Shook
(74) *Attorney, Agent, or Firm* — Maginot, Moore & Beck

(57) ABSTRACT

A method and encapsulation of a sensitive mechanical component structure in one embodiment includes a semiconductor substrate, and a film covering a component structure on the substrate, said film including at least one polymer layer, and at least one cavity formed between the component structure and the film, wherein at least one through contact penetrates through the film.

22 Claims, 2 Drawing Sheets

ENCAPSULATION, MEMS AND ENCAPSULATION METHOD

This application is a 35 U.S.C. §371 National Stage Application of PCT/EP2009/059009, filed Jul. 15, 2009, which claims the benefit of priority to Serial No. 10 2008 042 106.5, filed Sep. 15, 2008 in Germany, the disclosures of which are both incorporated herein by reference in their entirety.

BACKGROUND

The disclosure relates to an encapsulation, a microelectromechanical system (MEMS), and a method for encapsulating a sensitive component structure on a semiconductor substrate.

Sensitive, mainly mechanical, component structures of MEMS have to be encapsulated for protection against damage. Inertial sensors, such as acceleration sensors or rate-of-rotation sensors, are currently covered with KOH-etched silicon caps, the caps being connected with the aid of a seal glass connection on the semiconductor substrate having the sensitive component structure. A further established method for encapsulating sensitive component structures on semiconductor substrates is the anodic bonding of three-dimensionally structured glass wafers. In addition, structured silicon wafers as encapsulation are fixed to semiconductor substrates by various bonding methods. What is common to all the aforementioned methods is that a cost-intensive, three-dimensionally structured cap composed of silicon or glass is used.

DE 100 06 446 A1 describes a method for encapsulating sensitive component structures in the wafer stage. The known encapsulation comprises a frame structure composed of a cured reaction resin, said frame structure enclosing the component structure, and also a planar cap consisting of a flat (two-dimensional) plastic film and a cured reaction resin layer arranged thereabove, said cap covering the frame structure and forming a hollow space with the latter. What is disadvantageous about the known encapsulation is the complex production method thereof using an auxiliary film that firstly has to be applied and then has to be removed again.

US 2002/0121701 A1 describes an encapsulation method for encapsulating a non-MEMS wafer, wherein, in order to encapsulate the semiconductor substrate, the latter is coated with an initially liquid polymer layer. The known encapsulation is not suitable for MEMS owing to a lack of cavities.

SUMMARY

The disclosure addresses the problem of proposing an alternative, simple and cost-effective encapsulation for a mechanical component structure on a semiconductor substrate. Furthermore, the problem consists in specifying an MEMS comprising at least one encapsulation of this type, and also a production method for producing an encapsulated component structure.

This problem is solved in one embodiment with regard to the encapsulation, in another embodiment with regard to the MEMS, and in yet another embodiment with regard to the method. Advantageous developments of the disclosure are specified in the claims. All combinations of at least two of the features disclosed in the description, the claims and/or the figures fall within the scope of the disclosure. In order to avoid repetition, features disclosed in accordance with the method are intended to be applicable and claimable as disclosed in accordance with the device. Likewise, features disclosed in accordance with the device are intended to be applicable and claimable as disclosed in accordance with the method.

The disclosure is based on the concept of using, instead of a cost-intensive silicon wafer for encapsulating a sensitive mechanical component structure of an MEMS, a film comprising at least one polymer layer. In this case, the film is to be embodied and/or arranged in such a way that it covers the mechanical component structure at a distance. Particularly when the film, as will also be explained later, is shaped three-dimensionally by thermoforming and/or embossing, it is possible to dispense with photolithographic steps and PVD steps (PVD=physical vapor deposition), such as are employed in the case of KOH-etched silicon caps. An encapsulation embodied according to the concept of the disclosure is distinguished by at least one through contact which penetrates through the film. By virtue of the provision according to the disclosure of at least one through contact for making electrical contact with the semiconductor substrate, or an electronic and/or electrical element/region of the semiconductor substrate, it is possible to dispense with process steps such as wire bonding or transfer molding that are required in the prior art. Cost-effective processes and installations established in printed circuit board technology can be used to produce the through contacts. It is particularly preferred if a film, which is in particular three-dimensionally structured and preferably has a multiplicity of cavities, is used as early as in the wafer stage during the production of MEMS in order thus to simultaneously encapsulate a multiplicity of sensitive, mechanical component structures of a multiplicity of MEMS in a so-called wafer level process. In this case, an embodiment of the encapsulation in which the component structure is a constituent part of an inertial sensor, in particular of an acceleration sensor, or of a rate-of-rotation sensor, of a microphone or of a pressure sensor, is particularly advantageous. On account of the significantly reduced production costs, the encapsulation proposed is optimally suitable for consumer inertial sensors for use in handheld devices, so-called handhelds, such as mobile telephones, pocket PCs, etc. Furthermore, an encapsulation embodied according to the concept of the disclosure has great potential with regard to thickness reduction and size reduction in comparison with the encapsulations known from the prior art.

One development of the disclosure advantageously provides for the film to have a dimensional stability at the temperatures occurring during the bonding of the film. Preferably, the dimensional stability under heat is intended still to be ensured at temperatures of greater than 230° C. In the case of temperature loading up to 260° C. or 280° C., for example, for a short period of time, the film should advantageously be substantially at least dimensionally stable.

In addition or as an alternative to the abovementioned features, it is advantageous if the film has a lowest possible coefficient of expansion in order to avoid an impermissible deformation of the encapsulation and thus of the MEMS during subsequent use, even in the case of great temperature fluctuations. Preferably, the coefficient of expansion is less than 20 ppm/K, especially preferably less than 17 ppm/K, particularly preferably less than 10 ppm/K. Ideally, the polymer layer of the film preferably embodied as a multilayer film, especially preferably the entire film, with regard to its coefficient of expansion, exhibits isotropic behavior in the x-direction and also in the y-direction. For this purpose, the polymer layer, and/or the entire film can be biaxially oriented. Polymers for producing films having the properties mentioned above are sold for example under the designation "Vectra 540i" by Ticona or under the designation "Zenite 6330 NC" by Dupont. Furthermore, biaxially oriented polymer films of the Vectra type (manufactured by Kuraray or Rogers) are available with coefficients of expansion of even less than 5 ppm/K that are isotropic in the x- and y-directions. It is particularly expedient if the polymer layer of the film consists of liquid crystal polymer (LCP), or at least comprises this compound. Liquid crystal polymer has liquid-crystalline properties in the melt (thermophobic) or in solution (lyotropic). LCP is extremely thermostable (dimensionally stable) and additionally has a very low coefficient of expansion. A further advantage of LCP is that it is significantly more impermeable than a reaction resin such as is used in encapsulations from the prior art. Besides being formed from LCP, it is possible for the polymer layer of the film to be formed from an Ormocer. Furthermore, it may be advantageous for the polymer layer to be formed from polyether ether ketone (PEEK). The melting point thereof is 343° C. Polyether ether ketone is distinguished, in particular, by the fact that it is resistant to almost all organic or inorganic chemicals. It is also possible for the polymer layer to be formed from the following chemical polymer compounds: polyamide-imide (PAI) or polybenzimidazole (PBI), or polyphenylene sulfide (PPS) or polyaryl sulfone (PAS).

As mentioned in the introduction, an embodiment is especially preferred in which the film is shaped three-dimensionally, in order thus to form the cavity for covering the component structure. The at least one cavity can be introduced, for example, by injection molding, embossing, in particular injection-compression molding, thermoforming, deep-drawing or casting. During casting, the film polymer is poured into a mold and thereupon cured thermally or by UV radiation.

Alternatively, the cavity can also be closed with a two-dimensionally shaped film, in which case a spacer (frame), in particular constructed electrolytically, has to be provided between the semiconductor substrate and the film. This frame can be realized as required simultaneously with the electroplating of the through contacts, in particular by means of established stamping, drilling, photolithographic/etching and/or laser drilling processes.

One development of the disclosure advantageously provides for the film to comprise at least one metal layer in order to ensure a sufficient hermetic sealing of the film with regard to moisture and/or gas, in particular oxygen. Preferably, in this case the metal layer is formed from ductile copper. However, additionally or alternatively, a multiplicity of further metals such as nickel, aluminum, high-grade steel, etc., can also be used as metal layer(s). The metal should be chosen such that it has a high ductility (elongation at break), a low coefficient of expansion, of preferably less than 17 ppm/K, and a melting point of significantly greater than 280° C. It is particularly preferred, in order to ensure an optimum hermetic sealing, to provide at least two metal layers which preferably accommodate the polymer layer between them in a sandwich-like manner. Especially preferably, the two metal layers are in this case applied directly to the polymer layer.

In one development of the disclosure it is advantageously provided that, preferably in addition to the at least one metal layer, improving the hermetic sealing of the film, a metal layer, if appropriate making contact directly with a further bonding layer, is provided in order to be able to bond the encapsulation to the semiconductor substrate, preferably to a metallization of the semiconductor substrate, in a simplified manner. For bonding purposes, a thermocompression bonding method is advantageously used, in which case it is particularly preferred to coordinate the bonding system, that is to say all layers involved in the base, and also the pressure used such that bonding temperatures of less than 280° C., preferably around 260° C., can be realized.

Especially preferably, the film is attached to the semiconductor substrate with the aid of a so-called SLID bonding process (SLID=Solid-Liquid-Inter-Diffusion soldering method). By this means, a bonding frame (metallization) to be provided on the semiconductor substrate can be made very small. The SLID bonding technique is distinguished by the fact that it a layer of metal having a low melting point, for example tin, is applied between an upper and a lower layer composed of metal having a higher melting point, for example copper, and is melted at low temperatures. The metal that melts at higher temperatures then diffuses into the upper and the lower layer, and in the process an alloy having a higher melting point forms and solidifies. Consequently, during further bonding/soldering processes, remelting of the connection is reliably provided.

An embodiment in which the film thickness is less than 200 µm is particularly preferred. Especially preferably, the film thickness is less than 180 µm, especially preferably less than 160 µm. Preferably, the film thickness is approximately 120 µm, or less.

In order to increase the stiffness of the film, it is possible to provide at least one stiffening layer, preferably composed of metal, especially preferably composed of electrolytically applied copper. Additionally or alternatively, the stiffening layer can be realized as a sandwich layer (e.g.: Cu—Ni—Cu).

In addition or as an alternative to the provision of a stiffening layer, it is possible to stiffen the film by means of a corresponding three-dimensional shaping. For this purpose, it is possible to realize, for example, at least one curvature and/or at least one wave shape and/or an angular saw tooth shape and/or at least one, preferably polygonally contoured, turned-in portion (bead) facing in the direction of the semiconductor substrate. For mounting reasons it is advantageous for that side of the encapsulation which faces away from the MEMS to be embodied in planar fashion. It is also possible to provide at least one stop for the semiconductor substrate, where a stop should be understood to mean a small-area elevation which projects in the direction of the component structure and which prevents the component structure from being deflected to an excessively great extent or prevents the component structure from adhering to the film cover.

In one development of the disclosure it is advantageously provided that, in addition to at least one through contact, there is integrated into the film at least one redistribution wiring plane, embodied in particular as intermediate layer, preferably composed of electrically conductive metal, by means of which at least two connection regions of the semiconductor substrate and/or two external contacts can be electrically conductively connected to one another.

The disclosure also leads to an MEMS (microelectromechanical system) comprising an above-described encapsulation comprising at least one polymer layer and at least one through contact penetrating through the polymer layer.

Furthermore, the disclosure leads to a method for encapsulating a sensitive mechanical component structure on a semiconductor substrate, comprising the following steps: providing at least one film, preferably having a cavity, comprising at least one polymer layer and at least one through contact; relatively positioning the film (relative) to the semiconductor substrate, and bonding the film to the semiconductor substrate or a coating, preferably a bonding frame, in particular a metallization, of the semiconductor substrate. As a preceding step, provision can preferably be made for shaping the cavity into the film. This can be done, for example, directly during the process for producing the film, for example in the injection-molding method, or in a subsequent deformation step, in particular by deep-drawing and/or thermoforming.

It is especially preferred if the encapsulation is carried out as early as in the wafer stage of MEMS, such that a multiplicity of sensitive, mechanical component structures can be encapsulated simultaneously. For this purpose, a film which, in terms of its areal extent, preferably, at least approximately, corresponds to the areal extent of the wafer is positioned relative to the wafer, more precisely to the component structures provided on the wafer, whereupon the film is bonded to the wafer.

The bonding process is advantageously followed by the division (separation) of the wafer (with film) into a multiplicity of separate MEMS, in particular inertial sensors, in which case it is possible to realize severing of the film and the semiconductor substrate simultaneously, for example by laser cutting or sawing, or of the film and the wafer successively, for example by the film being precut with the aid of a saw or a laser beam and the uncovered semiconductor substrate being severed in a subsequent step.

BRIEF DESCRIPTION OF THE DRAWINGS

Further advantages, features and details of the disclosure will become apparent from the following description of preferred exemplary embodiments and with reference to the drawings. In the drawings.

DETAILED DESCRIPTION

In the figures, identical components and components having the same function are identified by the same reference signs.

Figure 1:
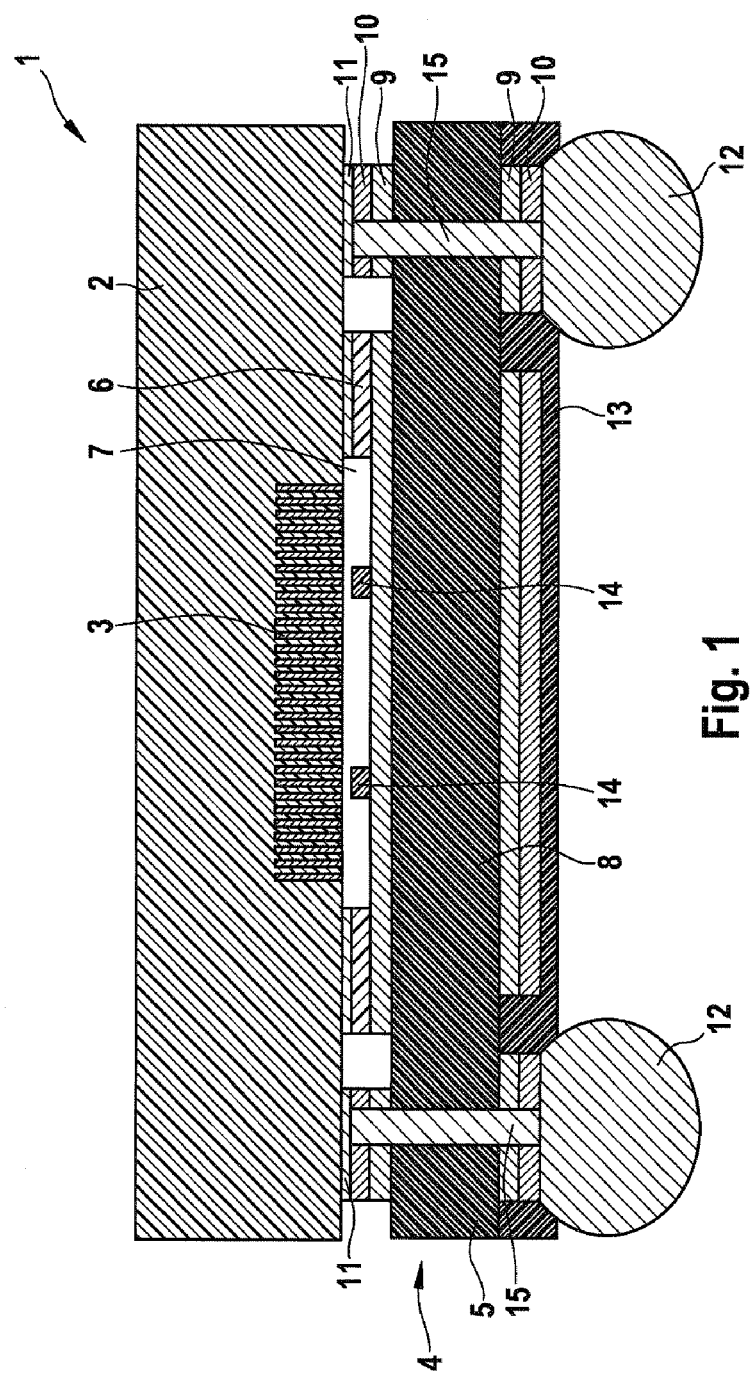
FIG. 1 shows a first exemplary embodiment of an encapsulated mechanical structure with a two-dimensional film.

FIG. 1 shows an MEMS 1 (microelectromechanical system). The MEMS 1 comprises a semiconductor substrate 2 with a sensitive, mechanical component structure 3 formed thereon, said component structure being formed from semiconductor material. The component structure 3 is protected against mechanical and other environmental influences, such as temperature and moisture and also gas, by an encapsulation 4. The encapsulation 4 comprises a film 5 embodied as a multilayer film. In the exemplary embodiment shown, the film 5 is shaped two-dimensionally and forms a cavity 7 together with a spacer 6, which is provided on the semiconductor substrate 2 and is embodied as a bonding frame, said cavity providing the component structure 3 with sufficient free space for movement.

The film 5 comprises a polymer layer 8, composed of LCP in the exemplary embodiment shown. The polymer layer 8 is coated with a first metal layer 9 on both flat sides. Said metal layer is formed from a copper film laminated onto the polymer layer and serves for optimizing the hermetic sealing of the cavity 7 closed by the film 5. A respective, namely second, metal layer which is formed from electrolytically reinforced copper in the exemplary embodiment shown, is in turn situated on the first metal layers 9. With the aid of said second metal layer 10, the film 5, on the side facing the semiconductor substrate 2, is connected to the semiconductor substrate 2 directly by means of a bonding layer 11. On that side of the film 5 which faces away from the semiconductor substrate 2, solder balls 12 for a flip-chip application are situated on the second metal layer 10 in regions electrically insulated from one another. It can be discerned that a soldering resist 13 is situated on that side of the film 5 which faces away from the semiconductor substrate 2, said soldering resist being applied partly on the second metal layer 10 and partly directly on the polymer layer 8. The direct contacting of the polymer layer 8 with soldering resist 13 results from a structuring of the first and the second metal layer 9, for the production of regions electrically insulated from one another.

Within the cavity 7, spacers 14 are provided on the first metal layer 9, said spacers limiting a deflection movement of the mechanical component structure 3.

As is further evident from FIG. 1, through contacts extending perpendicularly to the semiconductor substrate 2 penetrate through the polymer layer 8 of the film 5, said through contacts being formed in each case from electrolytically reinforced copper. The through contacts 15 directly connect the metal layers 9, 10 on both sides of the polymer layer 8 to one another, to be precise in regions electrically insulated from one another. By means of the bonding layer 11 and the through contacts 15, the semiconductor substrate 2 or electrical and/or electronically active regions or elements (not shown) of the semiconductor substrate 2 is or are electrically connected to a respective solder ball 12.

Figure 2:
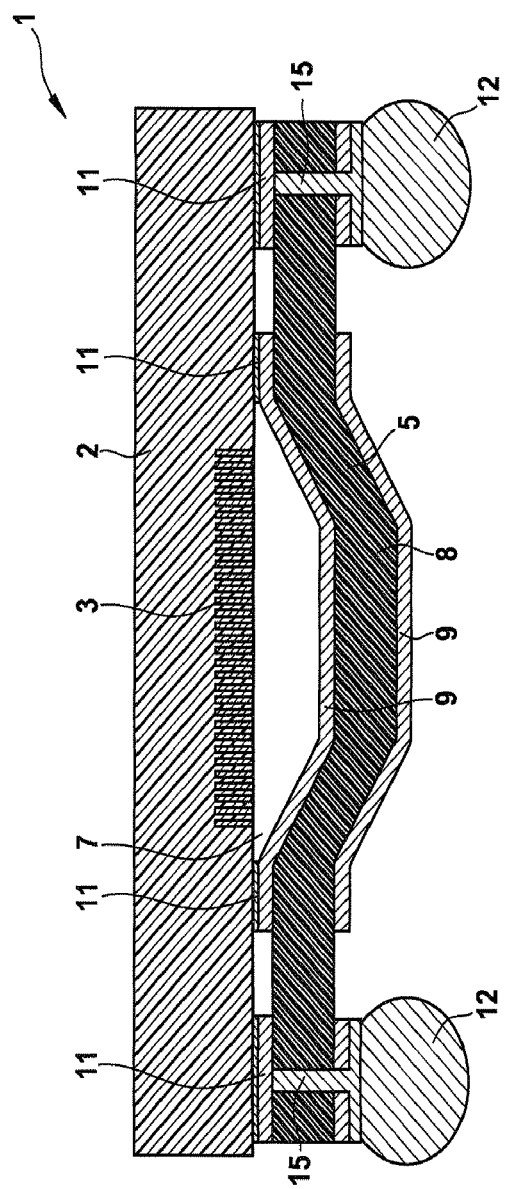
FIG. 2 shows a second, alternative exemplary embodiment of an encapsulation with a three-dimensionally structured film.

FIG. 2 shows an alternatively constructed MEMS. The semiconductor substrate 2 with its sensitive, mechanical component structure 3 can be discerned. At a distance from the component structure 3, with formation of a cavity 7, a film 5 realized as a multilayer film is fixedly connected to the semiconductor substrate 2. The film 5 is shaped three-dimensionally for example by thermoforming or injection molding. As in the exemplary embodiment in accordance with FIG. 1, the film 5 comprises a polymer layer 8 provided with a first metal layer 9 on both flat sides. The first metal layer 9 is directly fixed to the semiconductor substrate 2 by means of a bonding layer 11. In the exemplary embodiment in accordance with FIG. 2 as well, two through contacts 15 running perpendicularly to the semiconductor substrate 2 penetrate through the polymer layer 8, said through contacts in each case electrically conductively connecting a solder ball 12 electrically to the first metal layer 9 facing the semiconductor substrate 2, the semiconductor substrate 2 or electrical and/or electronic regions or elements (not shown) of the semiconductor substrate 2 being electrically conductively connected to the first metal layer 9, with which the through contacts 15 make contact, by means of the electrically conductive bonding layer 11. In the exemplary embodiment in accordance with FIG. 2 as well, those regions of the first metal layer 9 with which the through contacts 15 make contact, both on the side facing the semiconductor substrate 2 and on the side facing away, are electrically insulated from one another by a corresponding structuring of the first metal layer 9.

The invention claimed is:

1. An encapsulation of a sensitive mechanical component structure comprising:
   a semiconductor substrate;
   a sensitive mechanical component supported by the semiconductor substrate;
   a film covering the sensitive mechanical component on the substrate, said film comprising at least one polymer layer;
   at least one stiffening layer which increases the stiffness of the film; and
   at least one cavity formed between the sensitive mechanical component and the film, wherein at least one through contact penetrates through the film.

2. The encapsulation as claimed in claim 1, wherein the film is shaped three-dimensionally, in a manner forming the at least one cavity for the component structure.

3. The encapsulation as claimed in claim 1, wherein:
the film is planar; and
a first of the at least one cavity is defined at least in part by a spacer.

4. The encapsulation as claimed in claim 3, wherein the spacer is formed electrolytically.

5. The encapsulation of claim 1, wherein the film comprises:
at least one first metal layer making contact directly with a bonding layer on the semiconductor substrate.

6. The encapsulation of claim 5, wherein the film comprises;
at least one second metal layer making contact directly with the semiconductor substrate.

7. The encapsulation as claimed in claim 6, wherein the second metal layer is arranged directly on a side of the through contact which faces the semiconductor substrate.

8. The encapsulation of claim 5, further comprising a second metal layer, wherein the at least one first metal layer and the second metal layer enclose the at least one polymer layer in a sandwich-like manner so as to provide an improved hermetic sealing of the film.

9. The encapsulation of claim 1, wherein the thickness of the film is less than 200 μm.

10. The encapsulation of claim 9, wherein the thickness of the film is less than 160 μm.

11. The encapsulation of 1, wherein the film has at least one three-dimensional shaping which increases the stiffness of the film.

12. The encapsulation of claim 11, wherein the at least one three-dimensional shaping is a curvature, a wave shape, a turned-in portion, a saw tooth shape, or a stop.

13. The encapsulation of claim 1, wherein the film has a redistribution wiring plane, embodied as an intermediate plane.

14. The encapsulation of claim 1, wherein the sensitive mechanical component structure comprises a microelectromechanical system (MEMS).

15. The encapsulation of claim 14, wherein the MEMS is an inertial sensor, a pressure sensor, a micromirror, or a microphone.

16. The encapsulation of claim 1, wherein the at least one stiffening layer is a sandwich layer.

17. A method for encapsulating a sensitive component structure on a semiconductor substrate, comprising:
providing a film comprising at least one polymer layer and at least one through contact penetrating through the film;
relatively positioning the film and the semiconductor substrate; and
bonding the film with the semiconductor substrate by bonding the film to a metallization coating of the semiconductor substrate.

18. The method as claimed in claim 17, wherein the semiconductor substrate is bonded with the film in the wafer stage.

19. An encapsulation of a sensitive mechanical component structure comprising:
a semiconductor substrate;
a film covering a component structure on the substrate, said film including;
at least one polymer layer;
at least one first metal layer making contact directly with a bonding layer on the semiconductor substrate; and
at least one second metal layer making contact directly with the semiconductor substrate; and
at least one cavity formed between the component structure and the film, wherein at least one through contact penetrates through the film.

20. The encapsulation as claimed in claim 19, wherein the second metal layer is arranged directly on a side of the through contact which faces the semiconductor substrate.

21. An encapsulation of a sensitive mechanical component structure comprising:
a semiconductor substrate;
a film covering a component structure on the substrate, said film including;
at least one polymer layer; and
a redistribution wiring plane embodied as an intermediate plane; and
at least one cavity formed between the component structure and the film, wherein at least one through contact penetrates through the film.

22. An encapsulation of a sensitive mechanical component structure comprising:
a semiconductor substrate;
a planar film covering a component structure on the substrate, said film including at least one polymer layer; and
at least one cavity formed between the component structure and the film, wherein at least one through contact penetrates through the film, and
wherein a first of the at least one cavity is defined at least in part by a spacer.

* * * * *